(12) United States Patent
Griessbaum

(10) Patent No.: US 7,619,558 B2
(45) Date of Patent: Nov. 17, 2009

(54) CLOCK PULSE CONTROL DEVICE OF A MICROWAVE PULSE RADAR

(75) Inventor: Karl Griessbaum, Muehlenbach (DE)

(73) Assignee: Vega Grieshaber KG, Wolfach (DE)

( * ) Notice: Subject to any disclaimer, the term of this patent is extended or adjusted under 35 U.S.C. 154(b) by 624 days.

(21) Appl. No.: 11/435,962

(22) Filed: May 17, 2006

(65) Prior Publication Data

US 2006/0274871 A1 Dec. 7, 2006

Related U.S. Application Data

(60) Provisional application No. 60/681,644, filed on May 17, 2005.

(30) Foreign Application Priority Data

May 17, 2005 (DE) ........................ 10 2005 022 558

(51) Int. Cl.
*G01S 13/08* (2006.01)

(52) U.S. Cl. ........................ 342/124; 342/85; 342/129; 342/135; 342/175

(58) Field of Classification Search ................. 342/124, 342/82–88, 98–103, 128–132, 134–137, 342/175, 195
See application file for complete search history.

(56) References Cited

U.S. PATENT DOCUMENTS

| | | | | |
|---|---|---|---|---|
| 4,219,813 | A * | 8/1980 | Collins ........................ | 342/202 |
| 4,242,683 | A * | 12/1980 | Cappon et al. ............... | 342/202 |
| 4,257,108 | A * | 3/1981 | Igel .............................. | 327/258 |
| 4,521,778 | A | 6/1985 | Knepper | |
| 5,563,605 | A | 10/1996 | McEwan | |
| 6,087,978 | A * | 7/2000 | Lalla et al. ................... | 342/124 |
| 6,114,925 | A | 9/2000 | Lo | |
| 6,300,897 | B1 * | 10/2001 | Kielb .......................... | 342/124 |
| 6,628,229 | B1 * | 9/2003 | Johnson et al. .............. | 342/124 |
| 6,667,666 | B2 * | 12/2003 | Uzunoglu ................... | 331/173 |
| 6,864,833 | B2 * | 3/2005 | Lyon ........................... | 342/124 |
| 7,307,582 | B2 * | 12/2007 | Griessbaum et al. ........ | 342/124 |
| RE40,128 | E * | 3/2008 | Kielb .......................... | 342/124 |
| 7,412,337 | B2 * | 8/2008 | Michalski et al. ............. | 702/55 |
| 7,518,548 | B2 * | 4/2009 | Edvardsson ................. | 342/124 |
| 7,532,155 | B2 * | 5/2009 | Kleman et al. .............. | 342/124 |

(Continued)

FOREIGN PATENT DOCUMENTS

DE 3107444 10/1982

(Continued)

*Primary Examiner*—John B Sotomayor
(74) *Attorney, Agent, or Firm*—Fay Kaplun & Marcin, LLP

(57) ABSTRACT

The invention relates to a clock pulse control circuit for generating a transmit clock pulse (ts) and a sampling clock pulse (ta; tb; tc), wherein the clock pulse control circuit comprises a first oscillator for generating a first clock pulse (ts) of a first frequency, and a second oscillator for generating a plurality of second clock pulses (ta; tb; tc), that are shifted in time in relation to each other, of a second frequency. The clock pulse control circuit is designed such that based on the first clock pulse (ts) and the plurality of second clock pulses (ta; tb; tc) the transmit clock pulse (ts) is providable to a transmit pulse generator, and the sampling clock pulse (ta; tb; tc) is providable to a sampling pulse generator.

25 Claims, 5 Drawing Sheets

U.S. PATENT DOCUMENTS

| | | | |
|---|---|---|---|
| 2005/0168379 A1* | 8/2005 | Griessbaum et al. | 342/124 |
| 2006/0274871 A1* | 12/2006 | Griessbaum | 375/354 |
| 2007/0182621 A1* | 8/2007 | Fehrenbach et al. | 342/124 |
| 2008/0024354 A1* | 1/2008 | Fehrenbach et al. | 342/124 |
| 2009/0128395 A1* | 5/2009 | Baath | 342/124 |

FOREIGN PATENT DOCUMENTS

| | | |
|---|---|---|
| DE | 29815069 | 2/1999 |
| DE | 10106681 | 1/2003 |
| JP | 55093076 A * | 7/1980 |
| JP | 62245980 A * | 10/1987 |

* cited by examiner

CLOCK PULSE CONTROL DEVICE OF A MICROWAVE PULSE RADAR

REFERENCE TO RELATED APPLICATIONS

This application claims the benefit of the filing date of U.S. Provisional Patent Application No. 60/681,644 filed May 17, 2005 and of German Patent Application No. 10 2005 022 558.6 filed May 17, 2005, the disclosure of which applications are hereby incorporated herein by reference.

FIELD OF THE INVENTION

The present invention relates to a clock pulse control device and a method for generating certain transmit- and sampling clock pulses, and to a distance measuring device for measuring distances.

BACKGROUND OF THE INVENTION

For continuously measuring the fill level of liquids and solids in containers, utilising measurement of the run time of electromagnetic waves, measuring devices are usually installed on or in the ceiling of the container, wherein said measuring devices subsequently transmit waves, either guided through a waveguide or radiated by way of an antenna, in the direction of the product contained in the container. The waves reflected by the product contained in the container are subsequently received by the measuring device. From the measured run time the distance between the sensor and the product contained in the container can be derived, while from the knowledge of the position of the sensor from the bottom of the container the sought fill level can be obtained.

Various methods are known in order to carry out run time measurements of these devices, which when the wave is radiated by way of an antenna is referred to as a radar fill level sensor, and when the wave is guided is often referred to as a TDR fill level sensor (time domain reflectometry). The two most-often used methods are the FMCW method and the pulse radar method. In the FMCW method, the transit time results from a measured differential frequency between the transmitted and the received continuous high frequency signal that has been frequency modulated in a linear manner.

In the pulse radar, short high-frequency pulses are emitted which are received after the corresponding run time. The time that has passed in between has to be determined as precisely as possible. Since the waves propagate almost at the speed of light the times to be measured are correspondingly short so that normally circuit arrangements are used which by way of sequential sampling of the receive signal convert said receive signal to a slowed down image that is true to the original. This method, which is often referred to as the ETS (equivalent time sampling) method, is described in DE 31 07 444. There, as well as in specification DE 029 81 5069 U1, circuit designs are described with which the desired slow-down in time can be achieved. The sampling method used is based on a sampling signal which from each receive signal triggered by a transmission pulse generates only one brief sampling value. If one controls the position in time of the sampling values relative to the transmit signal or receive signal so that a continuous linear increase in the sampling time between transmit pulses results, then the individual sampling values placed one behind the other result in the desired slowed down receive signal. In this process the amount of the increase in the sampling time relative to the transmit pulse determines the extent of the time expanding.

Two methods are known that cause the required linear increase in the sampling time. One method is characterised by an oscillator or a clock pulse control circuit with a adjustable downstream delay circuit. The pulse generated by the clock pulse signal source triggers not only emission of the transmit pulses, but also, delayed by way of the adjustable delay circuit, generation of the sampling signal. U.S. Pat. No. 5,563,605 describes one implementation of this method.

The second method for implementing the linear increase in the sampling time comprises two oscillators whose frequencies differ slightly. From one oscillator, clock-pulse flanks for triggering the transmit pulse are derived, while from the other oscillator clock-pulse flanks for triggering the sampling signal are obtained. As a result of the slight frequency difference, wherein the sampling repetition frequency is preferably somewhat lower than the transmit repeat frequency, the point in time of sampling shifts, relative to the point in time of transmission, in a linear manner from one transmission period to the next. As long as the frequency difference of the two oscillators is kept constant, high linearity of the time shift and thus high measuring accuracy can be achieved. For this reason one of the two oscillators is designed such that it can be varied via a frequency by way of a control input. The frequency of this oscillator is regulated such that a frequency difference of the two oscillators corresponds to a desired value to be specified. In this arrangement the ratio of transmit repeat frequency to frequency difference determines the time expanding factor of the sampling method.

DE 101 06 681 discloses the formation of the frequency difference by means of a digital phase detector. Usually a signal that most often is a square-wave signal whose frequency corresponds to the difference between the two oscillator frequencies results from forming the frequency difference. Measuring and comparing this difference with a specified desired value makes it possible to regulate one of the oscillators. In a simple manner this can largely be handled by a microcontroller. In this way it also becomes possible, by way of software-based definition of various desired values, to set different time expanding factors for adapting the sensor to variable measuring conditions. However, the smaller the frequency difference set, the more problematical exact regulation of the frequency difference, because measuring the differential frequency requires the time duration corresponding to a full period, for example from one rising flank of the square-wave signal to the next one, so that the space in time in which regulation can become active becomes increasingly large as the differential frequency decreases.

PRESENTATION OF THE INVENTION

There may be a need to effectively implement a clock pulse control.

This need may be met by a clock pulse control circuit and by a method for generating a transmit clock pulse and a sampling clock pulse, as well as by a distance measuring device for measuring distances with the characteristics according to the independent claims.

According to an exemplary embodiment of the invention a clock pulse control circuit for generating a transmit clock pulse and a sampling clock pulse is provided. The clock pulse control circuit comprises a first oscillator for generating a first clock pulse of a first frequency and a second oscillator for generating a plurality of second clock pulses of a second frequency, the plurality of second clock pulses are shifted in time in relation to each other, wherein based on the first clock pulse and the plurality of the second clock pulses the transmit clock pulse are providable to a transmit pulse generator, and the sampling clock pulse are providable to a sampling pulse generator.

According to another exemplary embodiment of the invention a method for generating a transmit clock pulse and a sampling clock pulse for a clock pulse control circuit is provided. In this method in a first step a first clock pulse of a first frequency is generated, for example by a first oscillator; in a second step a plurality of second clock pulses of a second frequency are generated, for example by a second oscillator, the second clock pulses shifted in time in relation to each other; and in a third step a transmit pulse generator is provided with the transmit clock pulse, and a sampling pulse generator is provided with the sampling clock pulse, based on the first clock pulse and the plurality of second clock pulses.

According to still another exemplary embodiment of the invention a distance measuring device for measuring distances with a clock pulse control circuit according to the invention is provided.

According to an exemplary embodiment the clock pulse control circuit comprising two oscillators may generate a first clock pulse and a plurality of second clock pulses which, if necessary, are offset in time in relation to each other and comprise slightly different frequencies. These second clock pulses may also offset in time in relation to each other, but they may have the same frequency. Subsequently the generated first clock pulse as a transmit clock pulse may trigger a transmit pulse generator, and one of the plurality of second clock pulses as a sampling clock pulse may trigger a sampling pulse generator, or vice versa. Furthermore, the plurality of second clock pulses or the first clock pulse may exclusively or additionally be used for regulating or controlling the oscillators themselves.

If the pulse generators are triggered, by targeted provision of the transmit clock pulses and sampling clock pulses, the clock pulse control circuit may control the pulse generators such that by the sequential sampling method an output signal of the received transmit pulse may be generated, which output signal is true to the original and is time expanded. In doing so the sampling pulses may always sample the reflected transmit pulses at a point in time that is offset in time. Since the frequency of the sampling clock pulse and thus of the sampling pulse may for example be lower than that of the transmit pulses, the sampling pulse samples the reflected transmit pulses at an offset in time that may continually increase in relation to the transmit pulse. Since the run time of the transmit pulses hardly changes throughout the duration of measurement (after the sampling pulse has sampled a full period from one transmit pulse to the next and has again reached the start value of a transmit pulse), an image of a period of the transmit cycle may be obtained, which image may be true to the original and may be expanded in time.

If the oscillators are regulated and controlled, the clock pulse control circuit, by comparing the first clock pulse to a second clock pulse from the plurality of second clock pulses, may set the frequency difference and/or the offset in time between the first and the second clock pulse. For example, a differential frequency may be the result of this comparison. Based on this differential frequency it may then be possible, for example by a comparison with a specified desired value, to regulate or control one of the oscillators (or both oscillators).

One advantage of the clock pulse control circuit according to the invention may be that, by the plurality of sampling pulses, the sampling of the receive signal may be set to a particular partial range of the overall range between two transmit pulses, and that the frequency of measuring or the frequency of sampling may be increased. If, in order to save power, relatively low transmit and sampling repeat frequencies are selected, then normally, due to the method used, the entire range between two transmit pulses may be sampled for the purpose of a expanding in time, although for fill level measuring, depending on the container used, only a distance range from zero to at most some ten meters may be of interest. With the clock pulse control circuit according to the invention it may now be possible in a targeted way to generate a particular sampling clock pulse with which the corresponding sampling pulse in a targeted manner samples a specific partial range of a transmit pulse, and thus samples a specific distance range. A further advantage of the clock pulse control circuit may be that hardly non-linearities in the electronic components that are involved in the implementation of the circuit occur. Usually, such deviations from linear characteristics may only be remedied by very high circuit expenditure. By generating clock pulses or clock-pulse flanks by way of oscillators, non-linearities and thus circuit expenditure may be reduced.

The invention may provide a further advantage in that controlling the clock pulse delay and regulating the differential frequency may for example take place by way of a microcontroller with digital-to-analogue converters connected thereto, and in this way both the distance range sampled within the receive signal and the selected time expansion factor may be adapted very flexibly to the measuring situation. Precise regulation of the frequency difference may be important for non-distorted expanding in time and may thus lead to good measuring accuracy.

According to a further exemplary embodiment of the invention the first oscillator and/or the second oscillator can be adjustable, controllable or regulable. In this way it may be for example possible to variably set the frequency and/or the clock pulse signal.

According to a further exemplary embodiment of the invention the clock pulse control circuit further comprises at least one delay element to generate the plurality of second clock pulses that are shifted in time in relation to each other.

If a plurality of time delay elements are provided, they may be connected serially or parallel in relation to a second clock pulse. A time delay element may receive any desired clock pulse and at its output may issue a clock pulse that is offset in time in relation to the received clock pulse. In the case of parallel connection of the time delay elements, by differently set time delay elements, differently time-offset clock pulses may be generated. On the other hand, in the case of a serial arrangement of the time delay elemenst, by way of this series connection differently time-offset clock pulses may be generated using identically set time delay elements. By using time delay elements with the same time delay, costs may be reduced.

According to a further exemplary embodiment of the invention the at least one time delay element is designed so as to be variably adjustable, controllable or regulable by a control input. In this way the shift in time of the clock pulses may be set in a targeted manner so that in the case of changing environmental conditions there is no need to replace all the time delay elements. In this way a clock pulse control circuit may be used for several environmental conditions, for example changing sizes of containers.

According to a further exemplary embodiment of the invention the clock pulse control circuit further comprises at least one subtraction unit. This subtraction unit can receive a first clock pulse and one of the plurality of second clock pulses and by way of comparison form a differential frequency. This differential frequency may reflect the time shift and the frequency difference between the transmit clock pulse and the sampling clock pulse so that this differential frequency may be used for controlling and regulating the clock pulse control circuit. Subtraction units may be provided with the use of various methods and components, such as for example by mixing the frequencies, the use of coincidence circuits, or the use of digital phase detectors.

According to a further exemplary embodiment of the invention the clock pulse control circuit further comprises at least one logical gate, wherein the logical gate may be designed for receiving the sampling clock pulses and for providing a mutual differential frequency. In this arrangement the logical gate may be an AND gate and/or an OR gate and/or an inverter, or a combination of such gates. This output signal that is formed in this way may comprise all the clock-pulse flanks of the different input clock pulses and may be compared to the first clock pulse in the subtraction unit in order to form a differential frequency in this way, which differential frequency has the same clock-pulse flanks as do all input signals of the logical gate.

According to a further exemplary embodiment of the invention the clock pulse control unit further comprises a control- or regulating unit which controls or regulates the first and/or the second oscillator. In a further exemplary embodiment the control- or regulating unit may be designed such a way that the control or regulating unit compares the differential frequency with a desired value and regulates the oscillators accordingly. In a further exemplary embodiment the control- or regulating unit may be connected, by way of an input, for example to a measuring process control system, a microcontroller or a processor, for example so as to control the oscillators by the differential frequency. Manual regulation may also be provided.

According to a further exemplary embodiment of the invention the clock pulse control circuit further comprises a selection device, wherein the selection device receives the second clock pulses and selects a second clock pulse that has been selected in a targeted manner. The first clock pulse and the second clock pulse that has been selected in a targeted manner may subsequently be conveyed as a transmit pulse to a transmit pulse generator, and as a sampling pulse to a sampling pulse generator. By the targeted selection of the second clock pulses, an option may be created of sampling distance ranges that have been determined based on the time shift between the second clock pulses and the first clock pulse, and of repeatedly sampling a specific measuring range at specifiable frequency, in particular at increased frequency. In a further exemplary embodiment the selection device may be designed such that by way of a control input a measuring process control system, a microcontroller or a processor is connectable so as to control selection of the second clock pulses.

It may also be possible to form several first clock pulses, one of which is subsequently selected in a targeted manner as a transmit clock pulse or a sampling clock pulse. The transmit clock pulse may be formed by the first clock pulse, while the sampling clock pulse may be formed by the selected one of the second clock pulses. As an alternative the sampling clock pulse may be formed by the first clock pulse, while the transmit clock pulse may be formed by the selected one of the second clock pulses.

The term oscillator may refer to a clock pulse generator which may generate a clock pulse at a particular frequency (e.g. 4 MHz). The differential frequency between the frequencies of the two oscillators may for example be in the order of 40 Hz.

According to a further exemplary embodiment of the method, for example by a time delay element a plurality of second clock pulses that are shifted in time in relation to each other may be generated. These second clock pulses, which are shifted in time in relation to the first clock pulse, may subsequently optimise the control and regulation of the oscillators of the clock pulse control circuit, and/or by triggering the sampling pulse generator they may improve and render more precise the distance measuring.

According to a further exemplary embodiment of the method, for example by a subtraction unit, in each case a differential frequency may be formed by comparing the first clock pulse to a respective one of the second clock pulses. This differential frequency obtained in this way may be used for controlling or regulating the oscillators. By using the plurality of second clock pulses several differential frequencies may be formed so that the oscillators may be monitored more frequently, and if needed may be readjusted. This may result in an enormous improvement in the precision and quality of the clock pulse control unit and of the distance measuring.

According to a further exemplary embodiment of the method, for example by a control- and regulating unit, the differential frequency may be compared to a desired value and in line with the result of the comparison the first and/or the second clock pulses, including the time delay and the frequency, may be adjusted. For example, the control- and regulating unit may be connected to a microcontroller or a measuring process control system in order to adjust the clock pulses, for example by way of oscillators. The oscillators may also be adjusted manually.

According to a further exemplary embodiment of the method, in a targeted way, for example using a selection device, selectively a particular first and/or second clock pulse may be provided to a transmit pulse generator as a transmit clock pulse, and/or to a sampling pulse generator as a sampling clock pulse. In this way a particular second clock pulse, which has been delayed in time, as a sampling clock pulse may trigger a sampling pulse generator in order to improve in this way the measuring occurrence of a particular measuring range or measuring range. Furthermore, in a further exemplary embodiment of the method, the selection device may be controlled by way of a processor, a measuring process control system, a microcontroller or manually, and consequently the second clock pulses may be selected.

According to a further exemplary embodiment of the method, for example with a logical gate, a shared output signal may be formed from the plurality of second clock pulses. In this way the frequency of measuring may be increased. According to a further exemplary embodiment of the method, for example a subtraction unit forms a shared differential frequency that is formed from the first clock pulse and the shared clock pulse signal from the plurality of second clock pulses. In this way the circuit expenditure may be reduced enormously because, for example, a single subtraction unit may be adequate.

According to a further exemplary embodiment of the method, for example with a variably adjustable time delay element, the delay of a second clock pulse may be adjusted, and the second clock pulse may be conveyed as a sampling pulse to a sampling pulse generator and/or as a transmit pulse to a transmit pulse generator, and/or said second clock pulse may be provided to a subtraction unit to form a differential frequency. By the free adjustability of this variable time delay element, for example by way of a processor, a microcontroller or manually, the time shift of the second clock pulses may be arbitrarily adjusted. At the same time the clock pulse control circuit may be variably adapted to changed conditions, because for example in the case of changed time shifts the time delay elements no longer have to be exchanged. In this way costs and time expenditure during adaptation to new conditions may be reduced enormously.

Furthermore, according to a further exemplary embodiment of the proximity sensor, in addition to the clock pulse control circuit according to the invention the proximity sensor comprises a transmit pulse generator, a sampling pulse generator, and a sampling mixer. The clock pulse control circuit provides a transmit clock pulse for triggering the transmit pulse generator, and a sampling clock pulse for triggering the sampling pulse generator, wherein the transmit pulse generator generates transmit pulses according to the transmit clock pulse, and the sampling pulse generator generates sampling pulses according to the sampling clock pulse. In the sampling mixer the transmit pulses that are reflected from the surface of the product contained in the container may be sampled by the sampling pulses, and the sampling values may be provided at an output.

According to a further exemplary embodiment of the distance measuring device, on the output of the sampling mixer an image of the reflected transmit pulses may be provided, which image is true to the original and/or has been time expanded. In this way distance measurements may be evaluated and processed with more precision and accuracy, and at the same time measuring errors may be reduced and avoided.

According to a further exemplary embodiment of the distance measuring device the latter is a fill level meter for measuring the fill level of the contents (for example of liquids or solids) in containers.

According to a further exemplary embodiment of the distance measuring device the latter may be a microwave pulse radar device which may determine the distance, for example by utilising measurements of the run time of electromagnetic waves.

The clock pulse control circuit according to an embodiment of the invention may make it possible to improve the measuring accuracy of distances while involving significantly reduced circuit expenditure. With the use of a plurality of sampling clock pulses a particular measuring range may be measured at significantly increased frequency of occurrence, whereby any changes in distance are measured immediately and the probability of a measuring error occurring may be significantly reduced. Furthermore, as a result of the plurality of sampling clock pulses the clock pulse control circuit according to the invention may provide significantly improved monitoring and adjustment options of the first and second clock pulses.

The embodiments of the clock pulse control circuit also apply to the method and to the distance measuring device, and vice versa.

BRIEF DESCRIPTION OF THE DRAWINGS

Below, for further explanation and to provide a better understanding of the present invention, several embodiments of the invention are described in more detail with reference to the enclosed drawings, as follows:

FIG. 1b shows a time diagram of the signals in relation to FIG. 1a;

FIG. 2b shows a time diagram of the signals in relation to FIG. 2a;

FIG. 3b shows a time diagram of the signals in relation to FIG. 3a;

DETAILED DESCRIPTION OF THE PREFERRED EMBODIMENTS

Figure 1A:
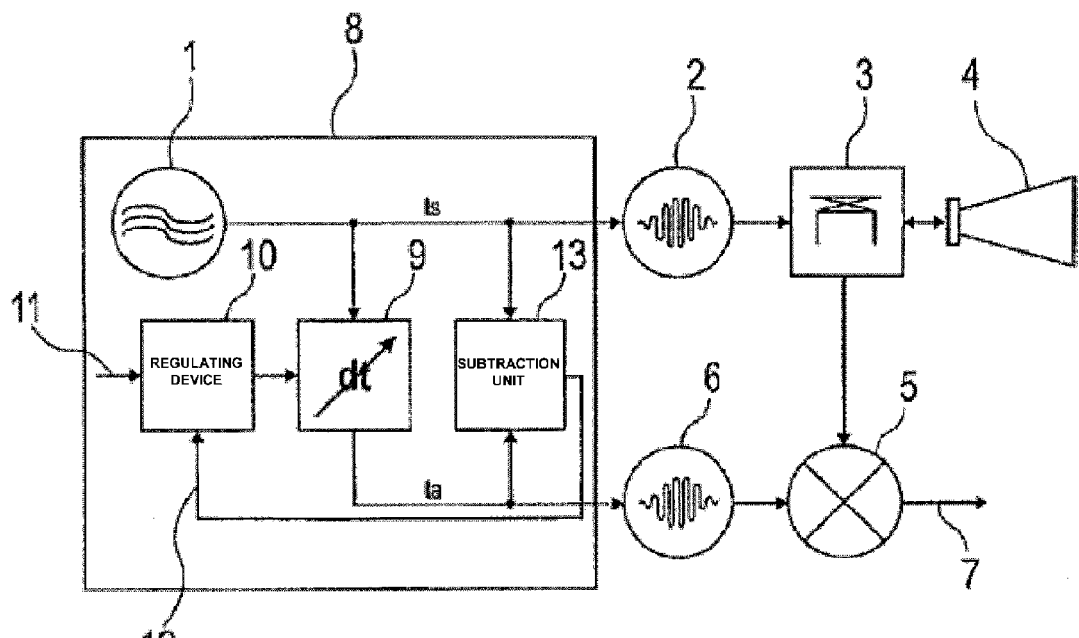
FIG. 1a shows a block diagram of a sampling circuit of a pulse radar with an oscillator and with an adjustable delay.

Identical or similar components in different figures have the same reference characters. The illustrations in the figures are diagrammatic and not to scale.

FIG. 1a shows a sampling circuit of a pulse radar in the form of a block diagram.

An oscillator 1 generates a transmit clock pulse ts, which by triggering a transmit pulse generator 2 controls generation of transmit pulses. By way of the directional coupler 3 the transmit pulses generated in this way are predominantly conveyed to the antenna 4 and from the latter are eradiated in the direction of the surface of the product contained in the container. The pulses reflected in the container by the product contained in the container are received after an interval that corresponds to their run time and, by way of the directional coupler 3, are conveyed, as a receive signal, to the sampling mixer 5. There, by means of sampling pulses that are generated in the sampling pulse generator 6, sampling values are taken from the receive signal within defined short periods of time. Together, at the output 7, the sampling values from the individual transmit-/receive periods result in the intermediary frequency signal (ZF) which is a slowed-down (time expanded) copy of the receive signal.

Generating the sampling pulses is controlled by the clock pulse control circuit 8, which generates a sampling clock pulse ta from the already mentioned transmit clock pulse. This takes place by way of the controllable time delay element 9 which at its output outputs the trigger flank of the transmit clock pulse ts, which trigger flank is present at its input, delayed by a defined time span. The magnitude of this time span is determined by a regulating device 10. Said regulating device 10 in turn is controlled by the desired value 11 which is changed in a linear manner by a process control system (not shown). By way of a second input the regulating device 10 obtains the actual value 12 of the time delay, which actual value 12 is formed by the subtraction unit 13 from the delayed clock pulse ta and the non-delayed clock pulse ts.

Figure 1B:
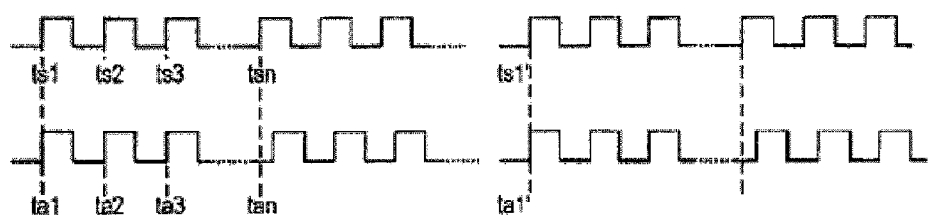

The time delay, which increases in a linear manner, between the two clock pulses, which time delay results from this regulation, is shown in FIG. 1b.

The top line shows the transmit clock pulse ts in short time sequences, interrupted by extended pauses. The lower line shows the sampling clock pulse ta, correlated in time. At the beginning of a measuring cycle, i.e. at the time ts1 and ta1 respectively, the flanks of the two clock pulse signals are almost synchronous in time because the set time delay of the time delay element 9 is minimal. Subsequently the time delay increases in a linear manner from one clock pulse period to the other so that the flanks ta2, ta3 etc. up to tan quasi continuously shift to the rear in relation to the flanks ts2, ts3 etc. up to tsn. After a defined amount of shift, which amount is given by the time range of the receive signal that is of interest and which determines the measuring range of the sensor, the delay at the point in time ts1' and ta1' respectively is reset to the starting value, and a new measuring cycle commences.

Using this method, by controlling the delay any desired measuring ranges can be sampled with a freely detectable slow-down factor. The regulation loop, which continuously has to regulate to a new desired value and to do so always requires the precise actual value, poses a problem in relation to the achievable linearity and thus accuracy.

Figure 2A:
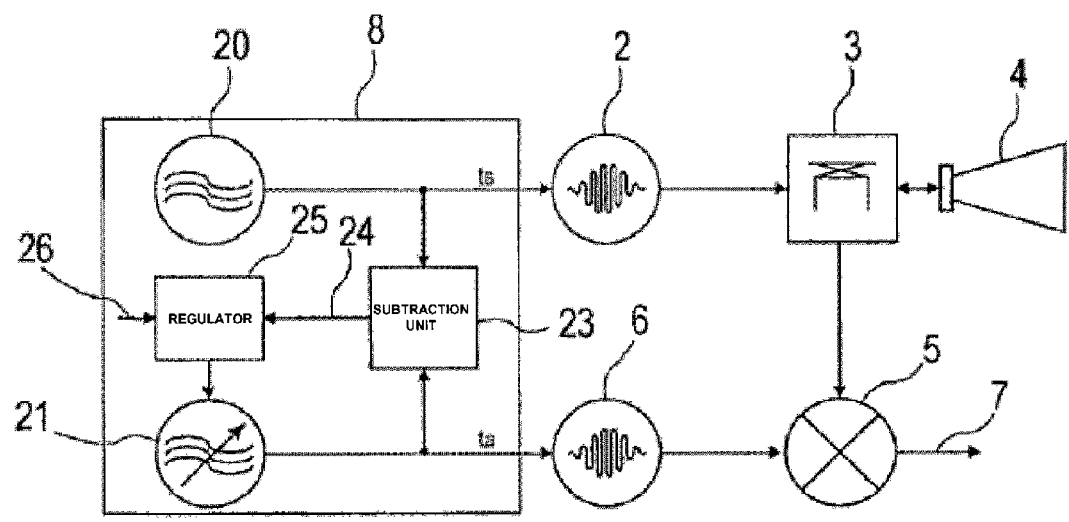
FIG. 2a shows a block diagram of a sampling circuit of a pulse radar with two oscillators and with differential-frequency regulation.

FIG. 2a is a block diagram of another method for the clock pulse control circuit of a pulse radar.

The block diagram of FIG. 2a differs from the block diagram of FIG. 1a in the region of the clock pulse control circuit 8. All the blocks positioned to the right of it exactly correspond to those in FIG. 1a and are not described anew. The clock pulse control circuit 8 comprises two oscillators 20 and 21 which oscillate at approximately the same frequency. In these positions oscillators can be used which based on their high quality generate little in the way of frequency jitter, for example quartz oscillators. While the output signal of the one oscillator 20 as the transmit clock pulse ts triggers the transmit pulse generator 2, the sampling pulses of the sampling pulse generator 6 are controlled by the output signal ta of the second oscillator 21. The subtraction unit 23 forms the differential frequency from the two clock pulses ts and ta which are conveyed to a regulator 25 by way of a differential frequency output 24. The regulator 25 compares the actually measured differential frequencies 24 with a specified desired value 26 and alters the oscillation frequency of the adjustable oscillator 21 so that the regulating deviation becomes minimal.

Figure 2B:
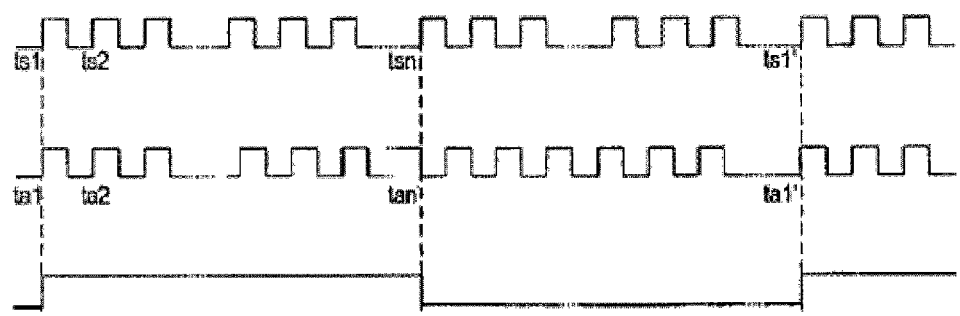

In FIG. 2b the corresponding clock pulse signals are shown in analogous form in relation to FIG. 1b.

While at the point in time ts1 equals ta1 both clock pulses are synchronous in time, due to the lower frequency of the oscillator 21 the flank of the sampling clock pulse ta continuously shifts in relation to the flank of the transmit clock pulse ts. At the time tsn=tan the two clock pulses are exactly in phase opposition. They again reach in-phase at the point in time ts1' equals ta1', so that a new cycle commences. The third line of FIG. 2b shows the differential frequency signal 24 formed by the subtraction unit. This signal can be generated in various ways, e.g. using a mixer circuit, a digital phase detector or a coincidence circuit. These circuit principles are well known to the average person skilled in the art, so that they are not discussed in detail in this patent specification. The frequency of the differential frequency signal 24 equals the difference between the frequencies of the two clock pulse signals. By measuring the periodicity of the differential frequency 24, i.e. the duration from ta1 to ts1', the regulator 25 obtains information about the actual value of the variable to be regulated. By way of a comparison with the desired value 26, regulation can thus become active. The regulator 25 can for example comprise a microcontroller with timer for measuring time; a digital-to-analogue converter for outputting the control value on the adjustable oscillator 21; as well as the corresponding software for controlling the controller. As an alternative to the above, regulating by way of a commonly used phase locked loop (PLL) or frequency regulation circuit is also possible. If high-quality oscillators are used the frequency regulation can be designed so as to be very stable, and the sampling linearity and thus the distance measuring accuracy are correspondingly good, provided any frequency drifts of the oscillators are detected in time and are regulated out.

In the case of very low differential frequencies 24, measuring their period necessarily can return a result only at large intervals. Any regulation deviation is therefore detected and regulated out with some delay, as a result of which the measuring accuracy is significantly impeded.

There is a disadvantage when compared to the method from FIG. 1 in that sampling always covers the entire range of a transmit clock pulse period so that always the entire measuring range determined by the transmit repeat frequency is sampled. In this way it is not possible to prematurely reset sampling to the start value, for example after a part of the measuring range that was of interest has been examined.

Figure 3A:
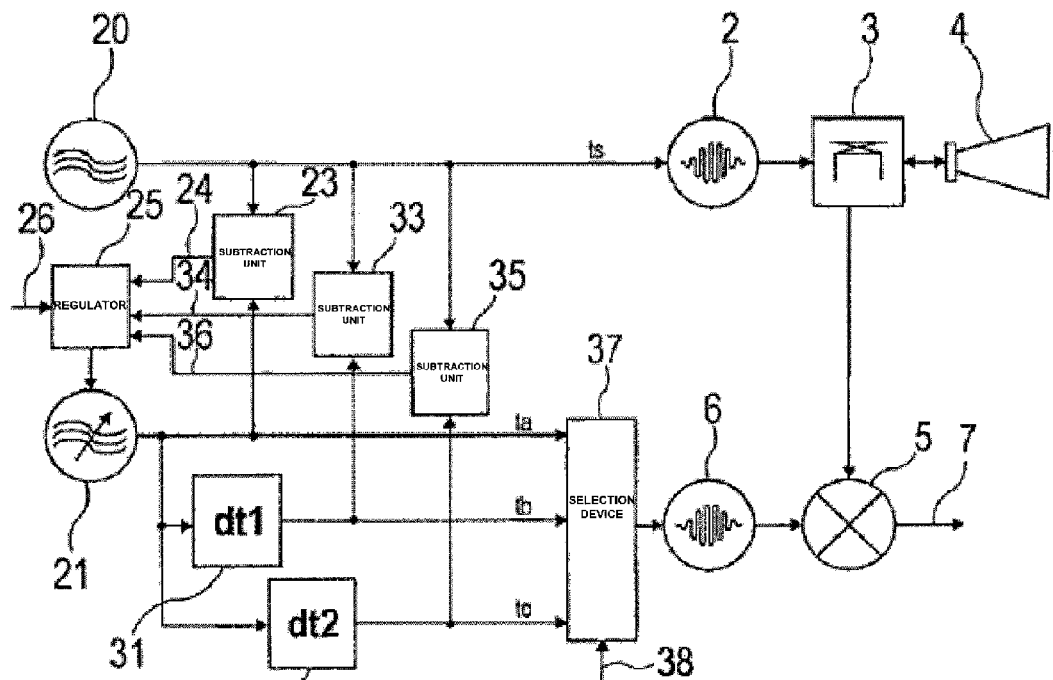
FIG. 3a shows a block diagram of a clock pulse control circuit according to the invention for generating the transmit clock pulses and sampling clock pulses of a pulse radar.

FIG. 3a shows a clock pulse control circuit for generating defined transmit- and sampling clock pulses ts, ta, tb, tc, and for measuring distances according to an exemplary embodiment of the invention.

A few of the components shown in FIGS. 1a, 2a are also shown in FIG. 3a. In this respect express reference is made to the corresponding description above.

In this arrangement the clock pulse control circuit among other things comprises a first oscillator 20 for generating a first clock pulse ts of a first frequency, and a second oscillator 21 for generating a plurality of second clock pulses ta, tb and tc, which are offset in time in relation to each other, of a second frequency. Based on the first clock pulse and the plurality of the second clock pulses the transmit clock pulse ts is made available to the transmit pulse generator 2, and the sampling clock pulse ta or tb or tc is made available to the sampling pulse generator 6.

FIG. 3a shows an exemplary embodiment of the method according to the invention. The clock pulse control circuit 8 comprises the two oscillators 20 and 21, the subtraction unit 23 that forms the differential frequency 24, and the control- and regulating unit 25 that compares the desired value 26 with the differential frequency 24, 34 or 36. Compared to the device shown in FIG. 2 the clock pulse control circuit 8 of FIG. 3a comprises at least one further subtraction unit 33 or 35, at least one time delay element 31 or 32, and preferably a selection device 37. The components arranged on the right beside the clock pulse control circuit according to the invention, namely the transmit pulse generator 2, the sampling pulse generator 6, the sampling mixer 5, the directional coupler 3 and the antenna 4 all function according to the description provided in relation to FIG. 1a and are not described again.

Corresponding to the method according to the invention, from at least one of the two oscillators, in this instance oscillator 21, at least two output clock pulses with different time delays, in this arrangement the second clock pulses ta, tb or tc, are derived. While ta represents the first second clock pulse of the oscillator 21, which second clock pulse differs from the first clock pulse ts, a clock pulse tb is generated, which is shifted in time in relation to the second clock pulse ta, which clock pulse tb is shifted in the time delay element 31 by a specified duration t1. Correspondingly, a further clock pulse tc, shifted in time, can arise through the second time delay element 32. The additional clock pulses ta, tb and tc are used in the subtraction units 23, 33 and 35 so as to form differential frequencies 24, 34 and 36.

Figure 3B:
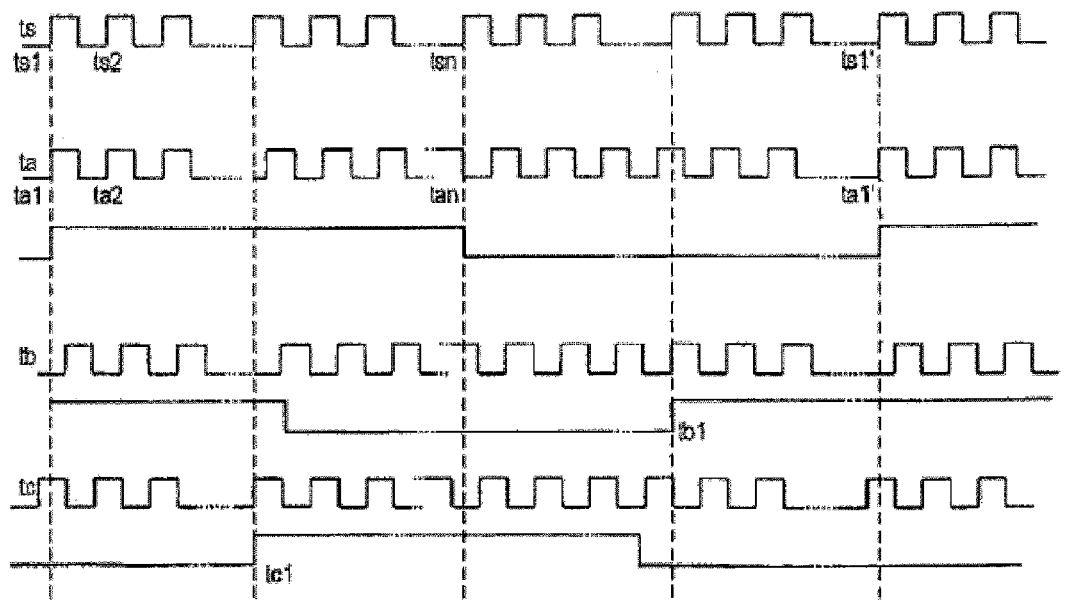

This is shown in more detail in FIG. 3b. From top to bottom the following signals are shown: the transmit clock pulse ts, the output clock pulse of the oscillator 21 ta, the differential frequency 24, second second clock pulse tb that is shifted in time, the differential frequency 34, the third second clock pulse tc that is shifted in time, and the differential frequency 36. The top three signals do not require any further explanation as they correspond to those shown in FIG. 2b. The second second clock pulse tb that is shifted in time is shifted by a specified time in relation to the clock pulse ta so that there is agreement in phase with the transmit clock pulse ts at another point in time, namely point tb1. Consequently, signal change of the associated differential frequency signal 34 takes place precisely at this point in time. The same applies to the clock pulse tc and the associated differential frequency signal 36 in the point in time tc1. All three differential frequency signals that have been generated in this way can be measured by the regulating unit 25 as far as their periods are concerned, and can be used as the current actual value, at the time, for the purpose of regulating. As a result of the time shift of the second clock pulses ta, tb, tc in relation to each other, the differential frequencies 24, 34 and 36 formed thereof are shifted at the same ratio in relation to each other. Since information about the regulating deviation always becomes available at the time when a flank of a differential signal occurs, for the purpose of regulating there is an advantage in that the intervals of measuring and readjusting are significantly shorter.

By way of the selection device 37 it is further possible to select one of the three different second clock pulses ta, tb or tc to drive the sampling pulse generator. Selection is by way of the input 38, wherein selection can be made by a control circuit in the form of a microcontroller. Depending on which one of the differently delayed clock pulses ta, tb or tc has been selected at the time, a different distance range of the radar sensor is sampled. If at the time only a particular distance range is of interest, then always precisely that sampling pulse ta, tb or tc can be selected from the available sampling pulses, which sampling pulse ta, tb or tc samples this range for a defined period of time.

The aforesaid is to be illustrated using an example: the transmit repeat frequency of the transmit clock pulse is 2.5 MHz. This leads to a maximum measuring range of 60 m, which results from the division of the period 400 ns and the constant of the distance-dependent run time of the wave 6.667 ns/m. If in the shown clock pulse control circuit 8 according to the invention the two time delay elements 31 and 32 are selected such that there are time delays for tb=133 ns and tc=267 ns, then in every instance always that clock pulse whose differential frequency previously indicated agreement in phase in the form of a rising flank can be switched through as a sampling clock pulse. With reference to FIG. 3b from the point in time ta1 the clock pulse ta is switched through and the measuring range is sampled, commencing at 0 meters. After a flank shift of 133 ns relative to the transmit clock pulse, corresponding to a measuring distance of 20 m, the point in time tc1 is reached, and clock pulse tc will be switched through, as a result of which the sampling procedure will commence anew at the distance value of zero meters. If the distance of 20 m is achieved anew, a change to clock pulse tb occurs and the range between zero m and 20 m is sampled for the third time. In this way it is not the maximum measuring range of 60 m that is examined, but instead the range that is of interest, in the present example the range between 0 m and 20 m, can be examined three times.

Figure 4:
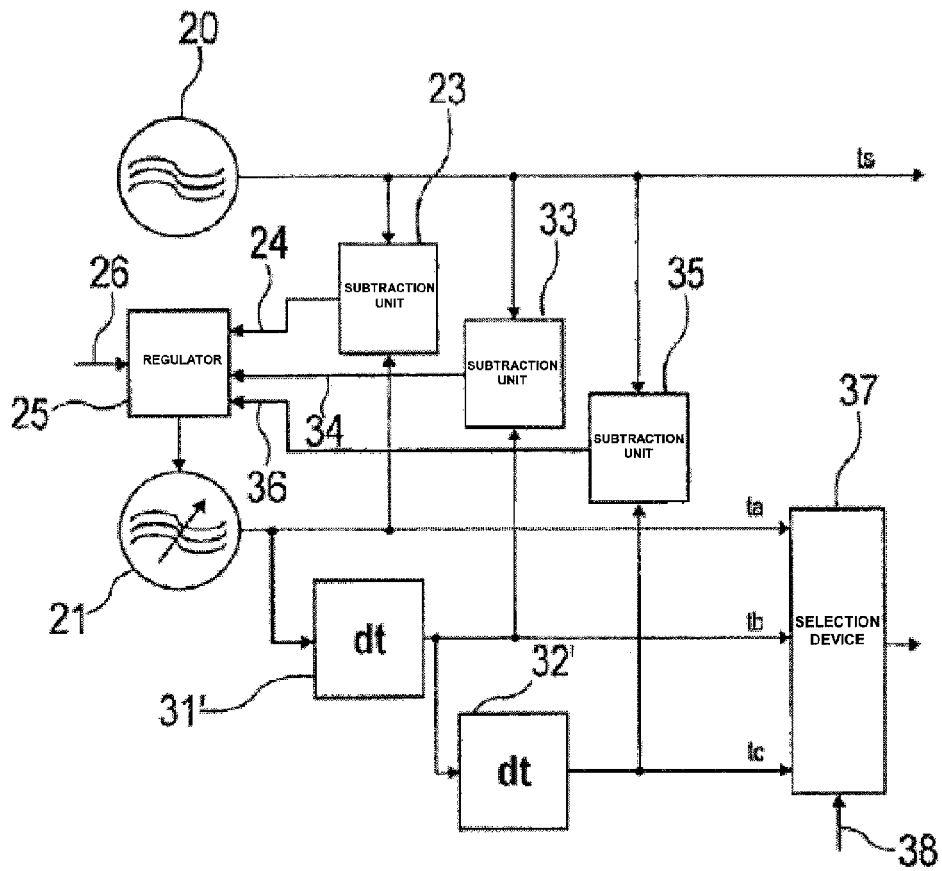
FIG. 4 shows a block diagram of a clock pulse control circuit according to the invention with serially connected time delay elements.

FIG. 4 shows a clock pulse control circuit according to another exemplary embodiment of the invention, which in comparison to the device in FIG. 3a only differs in the arrangement of the time delay elements 31' and 32'. While the time delay elements 31 and 32 are arranged so as to be parallel in FIG. 3a, in FIG. 4 a serial arrangement has been implemented. Therefore, for example, equal time delays can be selected for all time delay elements.

Figure 5:
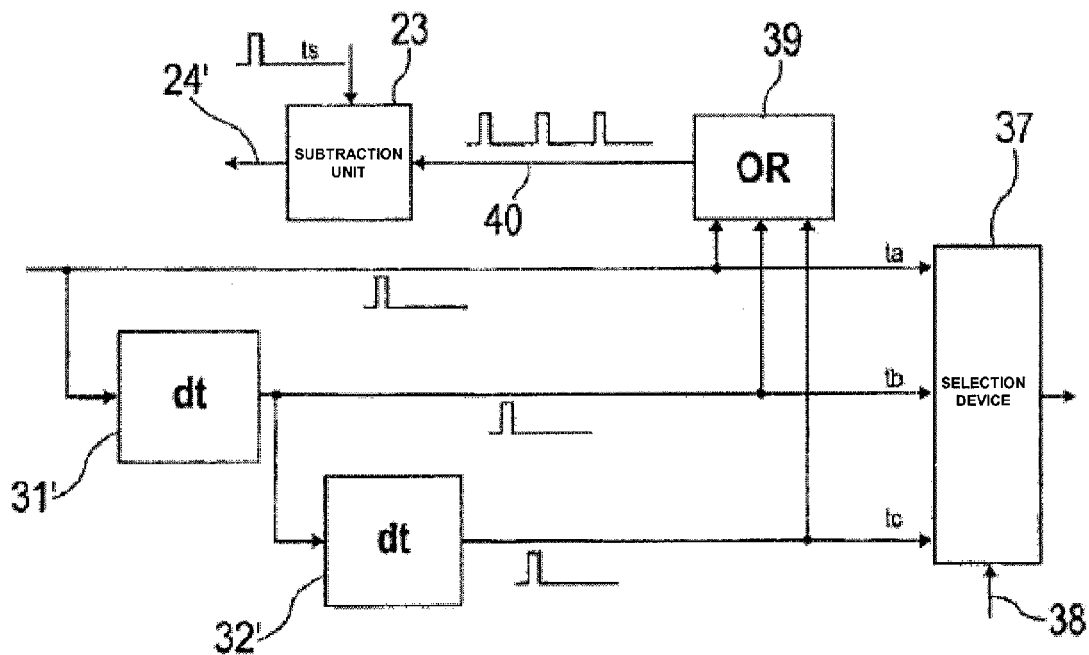
FIG. 5 shows an exemplary embodiment of the clock pulse control circuit according to the invention with a logical gate.

FIG. 5 shows a further variant of the circuit principle of FIG. 4, wherein only those parts are shown that are of importance to explaining the difference.

In this arrangement the rectangular sampling clock pulses have a highly asymmetrical ratio of high level to low level. By using a logical gate, preferably with an OR gate 39, an output signal 40 results which has all the flanks of the different input signals. Comparison with the also asymmetrical transmit clock pulse signal in the subtraction unit 23 provides a differential frequency signal 24' which in a slowed-down form contains the same flanks as the input signal 40 and thus advantageously makes possible more frequent measuring of the desired value, and thus improved regulation or control. In contrast to the embodiment shown in FIG. 4, the embodiment shown in FIG. 5 shows a single subtraction unit 23.

Figure 6:
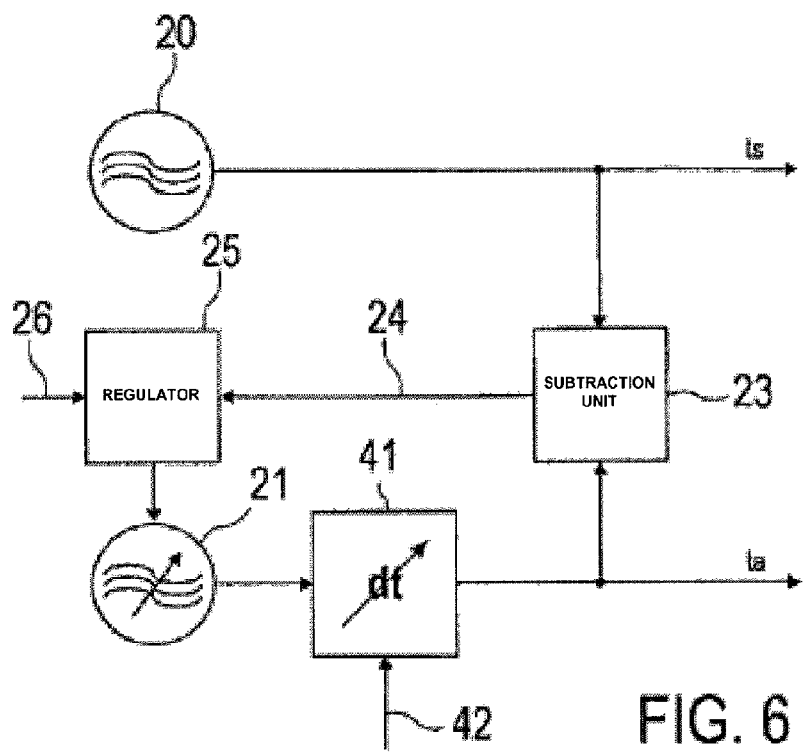
FIG. 6 shows a block diagram of a clock pulse control circuit according to the invention with a variably adjustable time delay element.

FIG. 6 shows a clock pulse control circuit according to another exemplary embodiment of the invention, which comprises a variably-adjustable time delay element 41. The latter is controlled by a measuring process control system, for example a microcontroller, so that the time delay through the input 42 is preferably changeable in steps. The points in time of switchover and the steps of the variable time delay can be selected such that sampling of the fill level metering device always takes place within a previously specified distance range which only includes a part of the maximum possible distance range.

Based on the above numerical example, for example steps of zero ns, 133 ns and 257 ns time delay are selected. The first stage of 0 ns is switched on first, and the rising flank of the differential signal is awaited. At this point sampling of the distance range commences at 0 m. This step is maintained up to a distance range of approximately 20 m, before the time delay is switched to 257 ns. Consequently, due to the agreement in phase between the transmit clock pulse and the sampling clock pulse at this time, a new flank of the differential frequency signal results. At the same time sampling again starts at zero m measuring distance. After sampling the measuring range of interest up to 20 m, a switchover to 133 ns time delay is made, and a further flank of the differential frequency signal and further sampling of the selected part of the overall measuring range is obtained. After this, again a switch to 0 ns time delay occurs and the cycle commences anew. In this way the same advantages are achieved as is the case with the arrangement according to FIG. 3a, but the switching expenditure is more modest, because only one subtraction unit 23, one time delay element 41 and no change-over switch 37 are needed.

Figure 7:
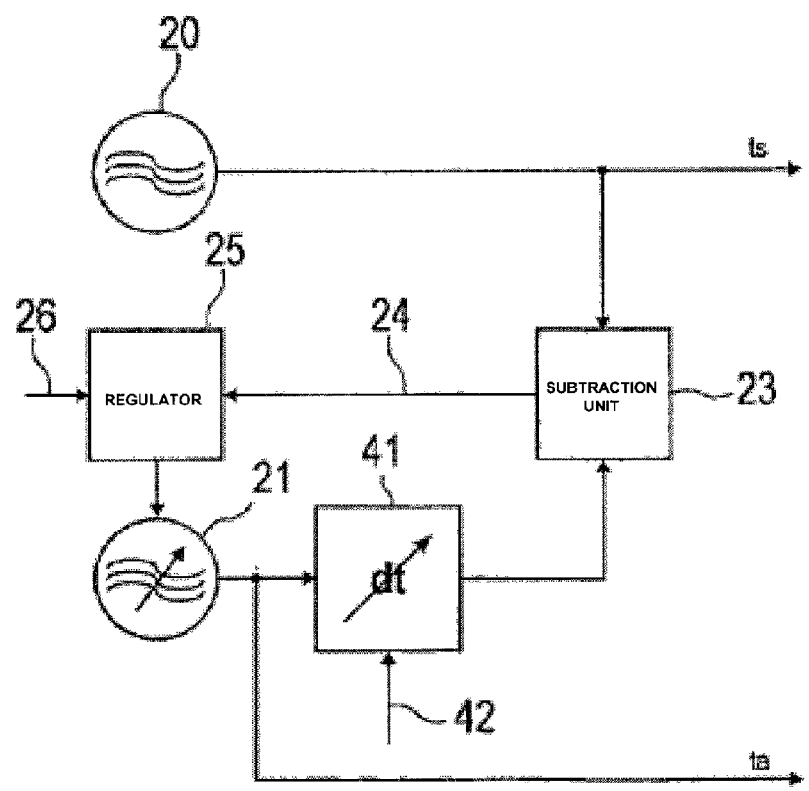
FIG. 7 shows a block diagram of a clock pulse control circuit according to the invention with a variably adjustable time delay element.

FIG. 7 is intended to show that the sampling clock pulse ta can be conveyed directly from the oscillator 21 to the sampling pulse generator in a way that is identical to that of the state of the art. Only the signal that goes to the subtraction unit 23 is delayed by the variable time delay element 41. In this way with changeover at the appropriate points in time, as described above, one obtains several flanks of the differential frequency signal and thus more frequent information concerning the actual regulating value, which leads to improved regulation. Conversely it is of course also possible to delay only the clock pulse to the sampling pulse generator rather than delaying the clock pulse to the subtraction unit, which approach while not improving regulation makes it possible to select only a part of the total range. The same applies of course also to the embodiments shown in FIGS. 3 and 4. Furthermore, it is of course also possible instead of delaying the sampling clock pulse to delay the transmit clock pulse or both clock pulses.

In addition it should be pointed out that "comprising" does not exclude other elements or steps, and "a" or "one" does not exclude a plurality. Furthermore, it should be pointed out that features or steps which have been described with reference to one of the above embodiments can also be used in combination with other features or steps of other embodiments described above. Reference characters in the claims are not to be interpreted as limitations.

The invention claimed is:

1. A clock pulse control circuit for generating a transmit clock pulse and a sampling clock pulse, comprising:
   a first oscillator generating a first clock pulse of a first frequency; and
   a second oscillator generating a plurality of second clock pulses, that are shifted in time in relation to each other, of a second frequency;
   wherein the clock pulse control circuit is adapted in such a way that based on the first clock pulse and the plurality of second clock pulses the transmit clock pulse is available to a transmit pulse generator, and the sampling clock pulse is available to a sampling pulse generator.

2. The clock pulse control circuit according to claim 1, wherein at least one of the first oscillator and the second oscillator is one of adjustable, controllable and open-loop controllable.

3. The clock pulse control circuit according to claim 1, further comprising at least one time delay element generating a plurality of second clock pulses that are shifted in time in relation to each other.

4. The clock pulse control circuit according to claim 3, further comprising a plurality of time delay elements of which at least a part is in at least one of series connection and parallel connection in relation to each other.

5. The clock pulse control circuit according to claim 3, wherein the at least one time delay element is designed to be one of variably adjustable, controllable and open-loop controllable by a control input.

6. The clock pulse control circuit according to claim 1, further comprising at least one subtraction unit forming at least one differential frequency from the first clock pulse and from the plurality of second clock pulses.

7. The clock pulse control circuit according to claim 1, further comprising a logical gate receiving the sampling clock pulses and providing a common output signal.

8. The clock pulse control circuit according to claim 1, further comprising one of a control unit and an open-loop control unit to one of control and open-loop control at least one of the first oscillator and the second oscillator.

9. The clock pulse control circuit according to claim 8, wherein one of the control unit and the regulating unit comparing a differential frequency with a desired value.

10. The clock pulse control circuit according to claim 1, further comprising a selection device selecting one of the second clock pulses, wherein one of the first clock pulse and the selected second clock pulse is conveyable as the transmit clock pulse to the transmit pulse generator and the other of the first clock pulse and the selected second clock pulse is conveyable as the sampling clock pulse to the sampling pulse generator.

11. The clock pulse control circuit according to claim 10, wherein the selection device is controllable by way of a control input.

12. A method for generating a transmit clock pulse and a sampling clock pulse for a clock pulse control circuit, comprising:
   generating a first clock pulse of a first frequency;
   generating a plurality of second clock pulses of a second frequency, wherein the plurality of second clock pulses are shifted in time in relation to each other;
   providing a transmit pulse generator with the transmit clock pulse, and
   providing a sampling pulse generator with the sampling clock pulse based on the first clock pulse and the plurality of second clock pulses.

13. The method according to claim 12, wherein by a time delay the plurality of second clock pulses that are offset in time in relation to each other are generated.

14. The method according to claim 12, wherein a differential frequency is formed by comparing the first clock pulse with a respective one of the plurality of second clock pulses.

15. The method according to claim 14, wherein the differential frequency is compared with a desired value and wherein in accordance with the comparison the frequency of one of the first and the plurality of second clock pulses is adjusted.

16. The method according to claim 12, wherein by selecting one of the plurality of second clock pulses one of (A) the transmit clock pulse is made available to the transmit pulse generator and (B) the sampling clock pulse is made available to the sampling pulse generator.

17. The method according to claim 16 wherein the selecting is controlled on the basis of a measuring process control system.

18. The method according to claim 12, wherein by a logical operation an output signal is formed from the plurality of second clock pulses.

19. The method according to claim 18, wherein by a subtraction unit a differential frequency is formed from the output signal and from the first clock pulse.

20. The method according to claim 12, wherein the time delay of a clock pulse is set by a measuring process control system, and wherein the clock pulse at least one of (A) triggers at least one of the sampling pulse generator and the transmit pulse generator and (B) is made available to a subtraction unit to form a differential frequency.

21. A distance measuring device for measuring distances, comprising a clock pulse control circuit including:
   a first oscillator generating a first clock pulse of a first frequency;
   a second oscillator generating a plurality of second clock pulses, that are shifted in time in relation to each other, of a second frequency;
   a transmit pulse generator; and
   a sampling pulse generator,
   wherein the clock pulse control circuit is adapted in such a way that based on the first clock pulse and the plurality of second clock pulses the transmit clock pulse is available to the transmit pulse generator, and the sampling clock pulse is available to the sampling pulse generator.

22. The distance measuring device according to claim 21, further comprising:
   a sampling mixer;
   wherein by the clock pulse control circuit the transmit clock pulse triggers the transmit pulse generator, and the sampling clock pulse triggers the sampling pulse generator;
   wherein the transmit pulse generator generates transmit pulses according to the transmit clock pulse and conveys the transmit pulses for transmitting by way of an antenna;
   wherein the sampling pulse generator generates sampling pulses according to the sampling clock pulse and conveys the sampling pulses to the sampling mixer; and
   wherein in the sampling mixer, by using the sampling pulses, values of the transmit pulses that are reflected by a surface of the product contained in the container can be sampled and can be made available to an output.

23. The distance measuring device according to claim 22, wherein the sampling mixer provides an image of the reflected transmit pulses on an output, and wherein the image at least one of (A) is true to the original and (B) has been time expanded.

24. The distance measuring device according to claim 21, wherein the distance measuring device is a fill level meter.

25. The distance measuring device according to claim 21, wherein the distance measuring device is a microwave pulse radar device.

* * * * *